(12) United States Patent
Iwamoto (10) Patent No.: US 12,009,799 B2
(45) Date of Patent: Jun. 11, 2024

(54) ACOUSTIC WAVE DEVICE, HIGH-FREQUENCY FRONT-END CIRCUIT, AND COMMUNICATION DEVICE

(71) Applicant: Murata Manufacturing Co., Ltd., Nagaokakyo (JP)

(72) Inventor: Hideki Iwamoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 346 days.

(21) Appl. No.: 17/567,918

(22) Filed: Jan. 4, 2022

(65) Prior Publication Data

US 2022/0131517 A1 Apr. 28, 2022

Related U.S. Application Data

(63) Continuation of application No. PCT/JP2020/025013, filed on Jun. 25, 2020.

(30) Foreign Application Priority Data

Jul. 5, 2019 (JP) ................. 2019-126540

(51) Int. Cl.
*H03H 9/02* (2006.01)
*H03H 9/64* (2006.01)

(52) U.S. Cl.
CPC .... *H03H 9/02551* (2013.01); *H03H 9/02015* (2013.01); *H03H 9/02228* (2013.01); *H03H 9/6483* (2013.01)

(58) Field of Classification Search
CPC ........... H03H 9/02535; H03H 9/02543; H03H 9/02551

USPC .................................... 333/186, 193
See application file for complete search history.

(56) References Cited

U.S. PATENT DOCUMENTS

| | | | |
|---|---|---|---|
| 2016/0133823 A1 | 5/2016 | Tai et al. | |
| 2018/0102761 A1* | 4/2018 | Takai | H03H 9/14544 |
| 2018/0109241 A1 | 4/2018 | Inoue et al. | |
| 2019/0123709 A1 | 4/2019 | Inoue et al. | |
| 2019/0190496 A1 | 6/2019 | Nosaka | |
| 2019/0319603 A1 | 10/2019 | Kadota et al. | |
| 2020/0021275 A1* | 1/2020 | Ueno | H04B 1/48 |
| 2020/0036360 A1 | 1/2020 | Tanaka | |

FOREIGN PATENT DOCUMENTS

| | | |
|---|---|---|
| JP | 2019080313 A | 5/2019 |
| WO | 2015012005 A1 | 1/2015 |
| WO | 2018/043610 A1 | 3/2018 |
| WO | 2018070369 A1 | 4/2018 |
| WO | 2018/097016 A1 | 5/2018 |

OTHER PUBLICATIONS

Official Communication issued in International Patent Application No. PCT/JP2020/025013 mailed on Aug. 25, 2020.

* cited by examiner

*Primary Examiner* — Rakesh B Patel
(74) *Attorney, Agent, or Firm* — Keating & Bennett, LLP (57) ABSTRACT

An acoustic wave device includes a support substrate, a piezoelectric layer, and an IDT electrode. The support substrate is made of quartz. The piezoelectric layer is provided on the support substrate and is made of LiTaO₃. The IDT electrode is on the piezoelectric layer and includes electrode fingers. The IDT electrode is on a negative surface side of the piezoelectric layer. The cut angle of the piezoelectric layer is equal to or more than about 39° Y and equal to or less than about 48° Y.

14 Claims, 4 Drawing Sheets

ACOUSTIC WAVE DEVICE, HIGH-FREQUENCY FRONT-END CIRCUIT, AND COMMUNICATION DEVICE

CROSS REFERENCE TO RELATED APPLICATIONS

This application claims the benefit of priority to Japanese Patent Application No. 2019-126540 filed on Jul. 5, 2019 and is a Continuation Application of PCT Application No. PCT/JP2020/025013 filed on Jun. 25, 2020. The entire contents of each application are hereby incorporated herein by reference.

BACKGROUND OF THE INVENTION

1. Field of the Invention

The present invention relates to an acoustic wave device, a high-frequency front-end circuit, and a communication device, and more particularly to an acoustic wave device including a support substrate and a piezoelectric layer, a high-frequency front-end circuit including an acoustic wave device, and a communication device including a high-frequency front-end circuit.

2. Description of the Related Art

An existing acoustic wave device including a support substrate and a piezoelectric layer has been known (see U.S. Patent Application Publication No. 2018/0109241, for example).

An acoustic wave device described in U.S. Patent Application Publication No. 2018/0109241 includes a support substrate made of quartz, a piezoelectric layer made of $LiTaO_3$ (lithium tantalate) laminated on the support substrate, and an IDT electrode formed on the piezoelectric layer.

In the existing acoustic wave device described in U.S. Patent Application Publication No. 2018/0109241, there is a possibility that a polarization direction or a cut angle of the piezoelectric layer causes a spurious mode due to the Rayleigh mode to occur in the vicinity of 0.7 times the pass band of the acoustic wave device, resulting in degradation of the characteristics of the acoustic wave device.

SUMMARY OF THE INVENTION

Preferred embodiments of the present invention provide acoustic wave devices, high-frequency front-end circuits, and communication devices that are each able to reduce or prevent a spurious mode.

An acoustic wave device according to a preferred embodiment of the present invention includes a support substrate, a piezoelectric layer, and an IDT electrode. The support substrate is made of quartz. The piezoelectric layer is on the support substrate and made of $LiTaO_3$. The IDT electrode is on the piezoelectric layer and includes a plurality of electrode fingers. The IDT electrode is on a negative surface side of the piezoelectric layer. A cut angle of the piezoelectric layer is equal to or more than about 39° Y and equal to or less than about 48° Y.

A high-frequency front-end circuit according to a preferred embodiment of the present invention includes a filter and an amplifier circuit. The filter includes an acoustic wave device according to a preferred embodiment of the present invention and enables a high-frequency signal in a predetermined frequency band to pass therethrough. The amplifier circuit is connected to the filter and amplifies the amplitude of the high-frequency signal.

A communication device according to a preferred embodiment of the present invention includes a high-frequency front-end circuit according to a preferred embodiment of the present invention and a signal processing circuit. The signal processing circuit processes the high-frequency signal.

According to acoustic wave devices, high-frequency front-end circuits, and communication devices according to preferred embodiments of the present invention, a spurious mode is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, acoustic wave devices, high-frequency front-end circuits, and communication devices according to preferred embodiments of the present invention will be described with reference to the drawings. FIG. 3, FIG. 4A, FIG. 4B, and FIG. 7 referred to in the following preferred embodiments and the like are schematic diagrams, and ratios of sizes and thicknesses of each of elements in the figures do not necessarily reflect actual dimensional ratios.

Preferred Embodiment (1) Configuration of Acoustic Wave Device, Multiplexer, High-Frequency Front-End Circuit, and Communication Device Configurations of an acoustic wave device, a multiplexer, a high-frequency front-end circuit, and a communication device according to the present preferred embodiment will be described with reference to the drawings.

(1.1) Acoustic Wave Device

Figure 1:
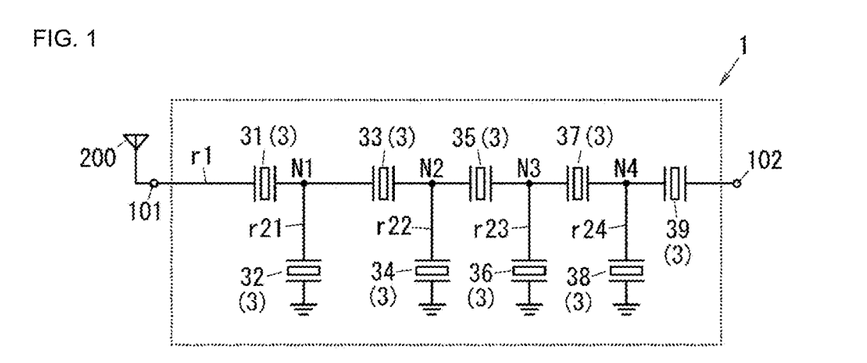
FIG. 1 is a circuit diagram of an acoustic wave device according to a preferred embodiment of the present invention.

As illustrated in FIG. 1, an acoustic wave device 1 according to the present preferred embodiment is provided between a first terminal 101 electrically connected to an antenna 200 outside the acoustic wave device 1 and a second terminal 102 different from the first terminal 101. The acoustic wave device 1 is, for example, a ladder filter and includes a plurality of (e.g., nine) acoustic wave resonators 31 to 39. The plurality of acoustic wave resonators 31 to 39 include a plurality of (e.g., five) series-arm resonators (acoustic wave resonators 31, 33, 35, 37, 39) provided on a first path r1 connecting the first terminal 101 and the second terminal 102, and a plurality of (e.g., four) parallel-arm resonators (acoustic wave resonators 32, 34, 36, 38) provided on each of a plurality of (four) second paths r21, r22, r23, and r24 connecting a plurality of (four) nodes N1, N2, N3, and N4 on the first path r1 to ground. Note that in the acoustic wave device 1, an element having a function of an inductor or a capacitor may be provided on the first path r1 as an element other than the series-arm resonator. Further, in the acoustic wave device 1, an element having a function of an inductor or a capacitor may be provided on each of the second paths r21, r22, r23, and r24 as an element other than the parallel-arm resonator.

(1.2) Multiplexer

Figure 2:
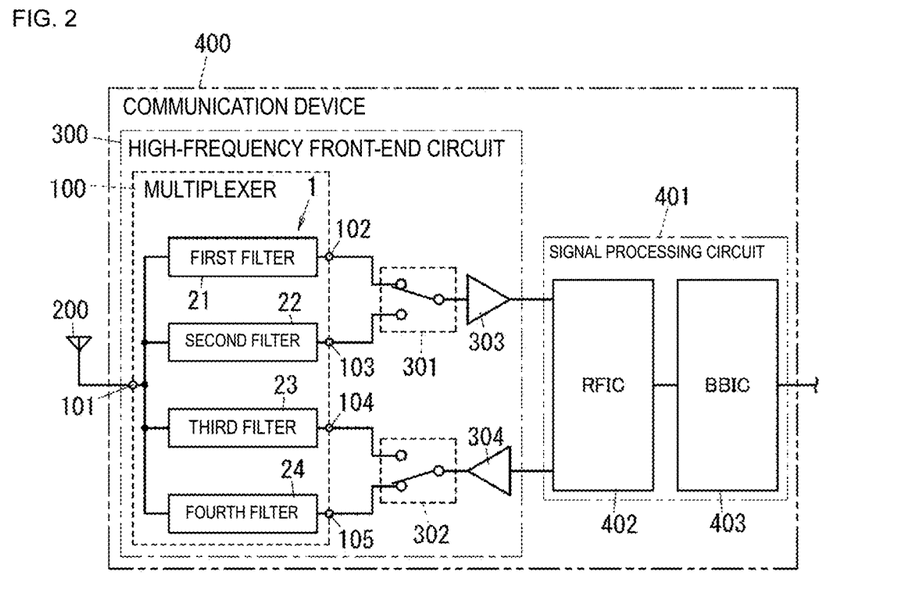
FIG. 2 is a configuration diagram of a communication device including an acoustic wave device according to a preferred embodiment of the present invention.

As illustrated in FIG. 2, a multiplexer 100 according to the present preferred embodiment includes the first terminal 101, the second terminal 102, a third terminal 103, a first filter 21 including the acoustic wave device 1, and a second filter 22.

The first terminal 101 is an antenna terminal that can be electrically connected to the antenna 200 outside the multiplexer 100.

The first filter 21 includes the acoustic wave device 1 and is a first reception filter provided between the first terminal 101 and the second terminal 102. The first filter 21 allows high-frequency signals in a predetermined first frequency band to pass therethrough and attenuates signals other than those in the first frequency band.

The second filter 22 is a second reception filter provided between the first terminal 101 and the third terminal 103. The second filter 22 allows high-frequency signals in a predetermined second frequency band to pass therethrough and attenuates signals other than those in the second frequency band.

The first filter 21 and the second filter 22 have pass bands different from each other. In the multiplexer 100, the pass band of the first filter 21 is a lower frequency band than the pass band of the second filter 22. Therefore, in the multiplexer 100, the pass band of the second filter 22 is located on the higher frequency side than the pass band of the first filter 21. In the multiplexer 100, for example, the maximum frequency of the pass band of the first filter 21 is lower than the minimum frequency of the pass band of the second filter 22.

In the multiplexer 100, the first filter 21 and the second filter 22 are connected to the common first terminal 101.

In addition, the multiplexer 100 further includes a fourth terminal 104, a fifth terminal 105, a third filter 23, and a fourth filter 24. However, in the multiplexer 100, the fourth terminal 104, the fifth terminal 105, the third filter 23, and the fourth filter 24 are not necessary elements.

The third filter 23 is a first transmission filter provided between the first terminal 101 and the fourth terminal 104. The third filter 23 allows high-frequency signals in a predetermined third frequency band to pass therethrough and attenuates signals other than those in the third frequency band.

The fourth filter 24 is a second transmission filter provided between the first terminal 101 and the fifth terminal 105. The fourth filter 24 allows high-frequency signals in a predetermined fourth frequency band to pass therethrough and attenuates signals other than those in the fourth frequency band.

(1.3) High-Frequency Front-End Circuit

As illustrated in FIG. 2, a high-frequency front-end circuit 300 includes the multiplexer 100, a first amplifier circuit 303, and a first switch circuit 301. In addition, the high-frequency front-end circuit 300 further includes a second amplifier circuit 304 and a second switch circuit 302. However, in the high-frequency front-end circuit 300, the second amplifier circuit 304 and the second switch circuit 302 are not necessary elements.

The first amplifier circuit 303 is electrically connected to the first filter 21 and the second filter 22 of the multiplexer 100. More specifically, the first amplifier circuit 303 is connected to the first filter 21 and the second filter 22 via the first switch circuit 301. The first amplifier circuit 303 amplifies a high-frequency signal (reception signal) that has passed through the antenna 200, the multiplexer 100, and the first switch circuit 301 and outputs the amplified high-frequency signal. The first amplifier circuit 303 is a low-noise amplifier circuit.

The first switch circuit 301 includes two selected terminals individually connected to the second terminal 102 and the third terminal 103 of the multiplexer 100, and a common terminal connected to the first amplifier circuit 303. That is, the first switch circuit 301 is connected to the first filter 21 via the second terminal 102 and is connected to the second filter 22 via the third terminal 103.

The first switch circuit 301 is defined by, for example, a single pole double throw (SPDT) switch. The first switch circuit 301 is controlled by a control circuit (not illustrated). The first switch circuit 301 connects the common terminal and the selected terminal in accordance with a control signal from the control circuit. The first switch circuit 301 may be defined by, for example, a switch integrated circuit (IC). Note that in the first switch circuit 301, the number of selected terminals connected to the common terminal is not limited to one, and may be a plurality of selected terminals. That is, the high-frequency front-end circuit 300 may be configured to correspond to carrier aggregation.

The second amplifier circuit 304 amplifies a high-frequency signal (transmission signal) output from the outside of the high-frequency front-end circuit 300 (for example, an RF signal processing circuit 402 described later) and outputs the amplified high-frequency signal to the antenna 200 through the second switch circuit 302 and the multiplexer 100. The second amplifier circuit 304 is, for example, a power amplifier circuit.

The second switch circuit 302 is defined by, for example, a single pole double throw (SPDT) switch. The second switch circuit 302 is controlled by the control circuit. The second switch circuit 302 connects the common terminal and the selected terminal in accordance with the control signal from the above-described control circuit. The second switch circuit 302 may be defined by, for example, a switch integrated circuit (IC). Note that in the second switch circuit 302, the number of selected terminals connected to the common terminal is not limited to one, and may be a plurality of selected terminals.

(1.4) Communication Device

As illustrated in FIG. 2, a communication device 400 includes the high-frequency front-end circuit 300 and a signal processing circuit 401. The signal processing circuit 401 processes a high-frequency signal. The signal processing circuit 401 includes the RF signal processing circuit 402 and a baseband signal processing circuit 403. Note that the baseband signal processing circuit 403 is not a necessary element.

The RF signal processing circuit 402 processes a high-frequency signal received by the antenna 200. The high-frequency front-end circuit 300 transmits a high-frequency signal (reception signal, transmission signal) between the antenna 200 and the RF signal processing circuit 402.

The RF signal processing circuit 402 is, for example, a radio frequency integrated circuit (RFIC), and performs signal processing on a high-frequency signal (reception signal). For example, the RF signal processing circuit 402 performs signal processing such as down-conversion on a high-frequency signal (reception signal) input from the antenna 200 via the high-frequency front-end circuit 300, and outputs the reception signal generated by the signal processing to the baseband signal processing circuit 403. The baseband signal processing circuit 403 is, for example, a baseband integrated circuit (BBIC). The reception signal processed by the baseband signal processing circuit 403 is used, for example, for image display as an image signal or for a call as an audio signal.

In addition, for example, the RF signal processing circuit 402 performs signal processing such as up-conversion on a high frequency signal (transmission signal) output from the baseband signal processing circuit 403, and outputs the high-frequency signal subjected to the signal processing to the second amplifier circuit 304. For example, the baseband signal processing circuit 403 performs predetermined signal processing on a transmission signal from the outside of the communication device 400.

(2) Each Constituent Element of Acoustic Wave Device

Hereinafter, each element of the acoustic wave device 1 according to the present preferred embodiment will be described with reference to the drawings. Here, the acoustic wave device 1 will be described focusing on one acoustic wave resonator.

Figure 3:
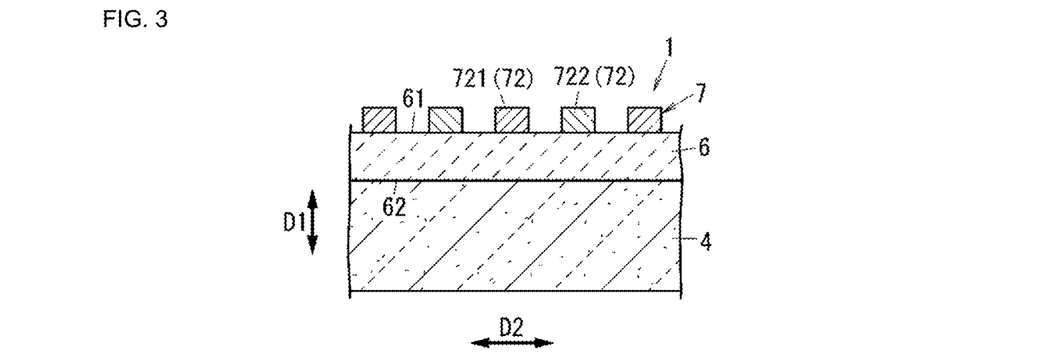
FIG. 3 is a cross-sectional view of the acoustic wave device in FIG. 1.
Figure 4A:
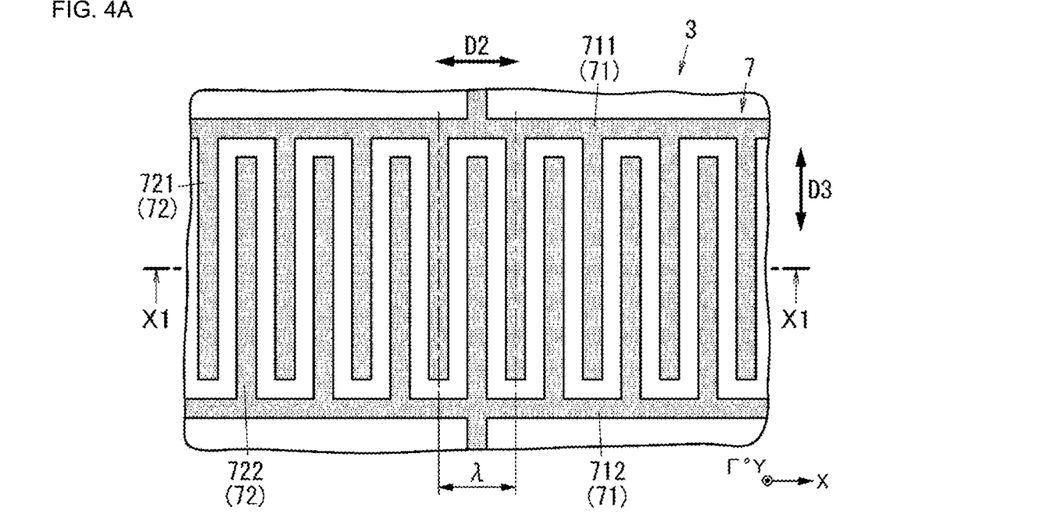
FIG. 4A is a plan view of a main portion of the acoustic wave device in FIG. 1.
Figure 4B:
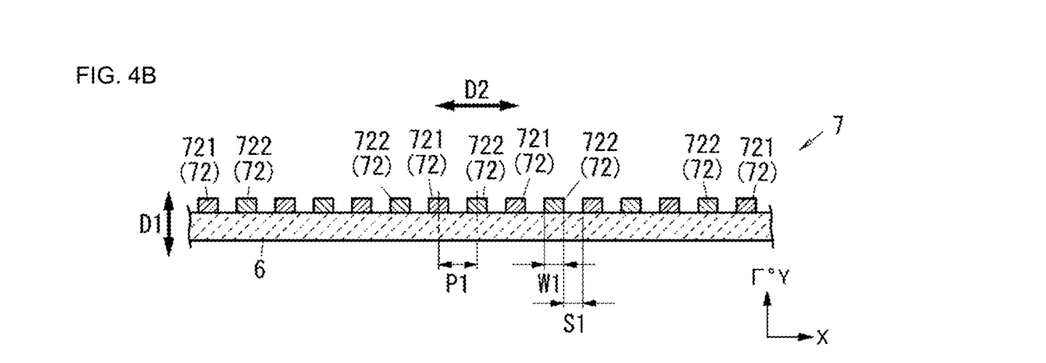
FIG. 4B is a cross-sectional view taken along a line X1-X1 of FIG. 4A.

As illustrated in FIG. 3, FIGS. 4A, and 4B, the acoustic wave device 1 includes a support substrate 4, a piezoelectric layer 6, and an interdigital transducer (IDT) electrode 7.

(2.1) Support Substrate

The support substrate 4 is a substrate made of quartz. More specifically, the support substrate 4 supports the piezoelectric layer 6 and the IDT electrode 7. An acoustic velocity of a bulk wave propagating through the support substrate is higher than an acoustic velocity of an acoustic wave propagating through the piezoelectric layer 6. An acoustic velocity of a bulk wave having the lowest acoustic velocity among a plurality of bulk waves propagating through the support substrate is higher than the acoustic velocity of the acoustic wave propagating through the piezoelectric layer 6. Each of a plurality of acoustic wave resonators 3 is, for example, a one-port acoustic wave resonator including reflectors (e.g., short-circuited gratings) on both sides of the IDT electrode 7 in an acoustic wave propagation direction. However, a reflector is not required. Note that each of the acoustic wave resonators 3 is not limited to a one-port acoustic wave resonator and may be, for example, a longitudinally coupled acoustic wave resonator including a plurality of IDT electrodes.

(2.2) Piezoelectric Layer

In the present preferred embodiment, the piezoelectric layer 6 is directly laminated on the support substrate 4. The piezoelectric layer 6 includes a first main surface 61 on the IDT electrode 7 side and a second main surface 62 on the support substrate 4 side. The piezoelectric layer 6 is provided on the support substrate 4 such that the second main surface 62 is on the support substrate 4 side.

The piezoelectric layer 6 is provided on the support substrate 4 and is made of, for example, LiTaO$_3$ (lithium tantalate). More specifically, the piezoelectric layer 6 is, for example, a Γ° Y-cut X-propagation LiTaO$_3$ piezoelectric single crystal. When three crystal axes of the LiTaO$_3$ piezoelectric single crystal are defined as an X-axis, a Y-axis, and a Z-axis, the Γ° Y-cut X-propagation LiTaO$_3$ piezoelectric single crystal is a LiTaO$_3$ single crystal obtained by being cut along a plane having, as a normal line, an axis rotated by Γ° in a Z-axis direction from the Y-axis with the X-axis as a central axis, and is a single crystal in which a surface acoustic wave propagates in an X-axis direction. For example, Γ° is equal to or more than about 39° and equal to or less than about 48°. The cut angle of the piezoelectric layer 6 is Γ=θ+90°, when Γ(°) is the cut angle and (φ, θ, ψ) is the Euler angles of the piezoelectric layer 6. The piezoelectric layer 6 is not limited to a Γ° Y-cut X-propagation LiTaO$_3$ piezoelectric single crystal, and may be, for example, a Γ° Y-cut X-propagation LiTaO$_3$ piezoelectric ceramics.

In the acoustic wave resonator 3 of the acoustic wave device 1 according to the present preferred embodiment, a mode of, for example, a longitudinal wave, an SH wave, an SV wave, or a mode in which these waves are combined is provided as a mode of an acoustic wave propagating through the piezoelectric layer 6. In the acoustic wave resonator 3, a mode having an SH wave as a main component is used as a main mode. The higher-order mode is a spurious mode occurring on a high-frequency side relative to a main mode of an acoustic wave propagating through the piezoelectric layer 6. Whether or not the mode of the acoustic wave propagating through the piezoelectric layer 6 is the "main mode which is a mode having an SH wave as a main component" can be confirmed by, for example, analyzing a displacement distribution by a finite element method using parameters (for example, material, Euler angles, thickness, and the like) of the piezoelectric layer 6, parameters (for example, material, thickness, electrode finger period, and the like) of the IDT electrode 7, and the like, and analyzing strain. The Euler angles of the piezoelectric layer 6 can be obtained by analysis.

Note that the single crystal material and the cut angle of the piezoelectric layer 6 may be appropriately determined according to, for example, required specifications of a filter (filter characteristics such as a passing characteristic, an attenuation characteristic, temperature characteristics, a band width and the like).

The thickness of the piezoelectric layer 6 is, for example, equal to or less than about 3.5λ, when λ is the wavelength of the acoustic wave determined by an electrode finger period of the IDT electrode 7. The electrode finger period is a period of a plurality of electrode fingers 72 of the IDT electrode 7. Thus, a Q value can be increased.

Preferably, the thickness of the piezoelectric layer 6 is, for example, equal to or less than about 2.5λ. As a result, a TCF (Temperature Coefficients of Frequency) can be improved. More preferably, the thickness of the piezoelectric layer 6 is, for example, equal to or less than about 1.5λ. Thus, an electromechanical coupling coefficient can be adjusted in a wide range. More preferably, the thickness of the piezoelectric layer 6 is, for example, equal to or more than about 0.05λ and equal to or less than about 0.5λ. Thus, the electromechanical coupling coefficient can be adjusted in a wider range.

(2.3) IDT Electrode

The IDT electrode 7 is provided on the piezoelectric layer 6. "Being formed on the piezoelectric layer 6" includes a case of being provided directly on the piezoelectric layer 6 and a case of being provided indirectly on the piezoelectric layer 6. The IDT electrode 7 is positioned on the opposite side to the support substrate 4 with the piezoelectric layer 6 interposed therebetween.

The IDT electrode 7 can be made of, for example, an appropriate metal material such as Al, Cu, Pt, Au, Ag, Ti, Ni, Cr, Mo, W, or an alloy including any of these metals as a main component. Further, the IDT electrode 7 may have a structure in which a plurality of metal films made of these metals or alloys is laminated. For example, the IDT electrode 7 is an Al film, but is not limited thereto, and may be, for example, a laminated film of a close contact film made of a Ti film formed on the piezoelectric layer 6 and a main electrode film made of an Al film formed on the close contact film. A thickness of the close contact film is approximately 10 nm, for example. In addition, a thickness of the main electrode film is, for example, approximately 130 nm.

As illustrated in FIGS. 4A and 4B, the IDT electrode 7 includes a plurality of busbars 71 and the plurality of electrode fingers 72. The plurality of busbars 71 includes a first busbar 711 and a second busbar 712. The plurality of electrode fingers includes a plurality of first electrode fingers 721 and a plurality of second electrode fingers 722. Note that illustration of the support substrate 4 is omitted in FIG. 4B.

Each of the first busbar 711 and the second busbar 712 has an elongated shape whose longitudinal direction is a second direction D2 (X-axis direction) orthogonal or substantially orthogonal to a first direction D1 (Γ° Y direction) along a thickness direction of the support substrate 4. In the IDT electrode 7, the first busbar 711 and the second busbar 712 face each other in a third direction D3 orthogonal or substantially orthogonal to both of the first direction D1 and the second direction D2.

The plurality of first electrode fingers 721 are connected to the first busbar 711 and extends toward the second busbar 712. Here, the plurality of first electrode fingers 721 extend from the first busbar 711 along the third direction D3. Tips of the plurality of first electrode fingers 721 are separated from the second busbar 712. For example, the plurality of first electrode fingers 721 have the same length and width.

The plurality of second electrode fingers 722 are connected to the second busbar 712 and extend toward the first busbar 711. Here, the plurality of second electrode fingers 722 extend from the second busbar 712 along the third direction D3. A tip of each of the plurality of second electrode fingers 722 is separated from the first busbar 711. For example, the plurality of second electrode fingers 722 have the same length and width. In the example of FIG. 4A, the length and width of the plurality of second electrode fingers 722 are the same or substantially the same as the length and width of the plurality of first electrode fingers 721, respectively.

In the IDT electrode 7, the plurality of first electrode fingers 721 and the plurality of second electrode fingers 722 are alternately arranged one by one to be separated from each other in the second direction D2. Therefore, the first electrode finger 721 and the second electrode finger 722 adjacent to each other in the longitudinal direction of the first busbar 711 are separated from each other. The electrode finger period of the IDT electrode 7 is a distance between corresponding sides of the first electrode finger 721 and the second electrode finger 722 adjacent to each other. The electrode finger period of the IDT electrode 7 is defined by (W1+S1), when W1 is a width of the first electrode finger 721 or the second electrode finger 722 and S1 is a space width between the adjacent first electrode finger 721 and second electrode finger 722. In the IDT electrode 7, a duty ratio, which is a value obtained by dividing the width W1 of the electrode fingers by the electrode finger period, is defined by W1/(W1+S1). The duty ratio is, for example, about 0.5. When a wavelength of an acoustic wave determined by the electrode finger period of the IDT electrode 7 is λ, λ is defined by a repetition period P1 of the plurality of first electrode fingers 721 and the plurality of second electrode fingers 722.

A group of electrode fingers (the plurality of electrode fingers 72) including the plurality of first electrode fingers 721 and the plurality of second electrode fingers 722 may have a configuration in which the plurality of first electrode fingers 721 and the plurality of second electrode fingers 722 are separated from one another in the second direction D2, and may have a configuration in which the plurality of first electrode fingers 721 and the plurality of second electrode fingers 722 are not alternately arranged to be separated from one another. For example, a region in which the first electrode fingers 721 and the second electrode fingers 722 are separated one by one and a region in which two of the first electrode fingers 721 or the second electrode fingers 722 are arranged in the second direction D2 may be mixed. The number of each of the plurality of first electrode fingers 721 and the plurality of second electrode fingers 722 in the IDT electrode 7 is not particularly limited.

(2.4) Arrangement of IDT Electrode and Cut Angle of Piezoelectric Layer

As illustrated in FIG. 3, the IDT electrode 7 is provided on a negative surface side of the piezoelectric layer 6. More specifically, in the piezoelectric layer 6, the first main surface 61 is the negative surface and the second main surface 62 is a positive surface. In other words, the piezoelectric layer 6 is provided on the support substrate 4 such that the first main surface 61 is the negative surface and the second main surface 62 is the positive surface. The IDT electrode 7 is provided on the first main surface 61, that is, the negative surface of the piezoelectric layer 6.

Figure 5:
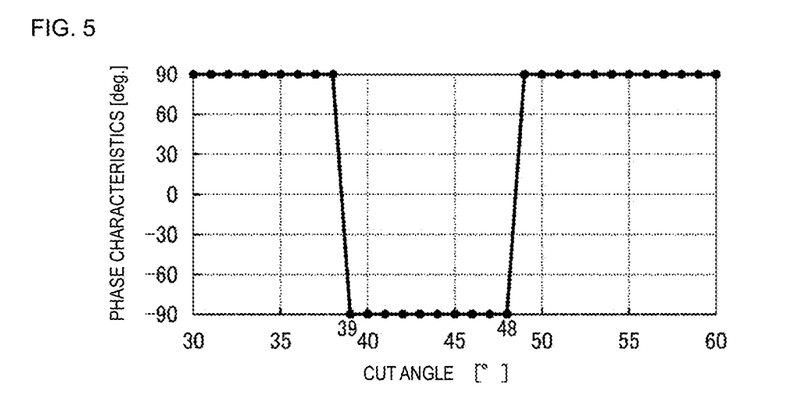
FIG. 5 is a graph showing a relationship between the cut angle of a piezoelectric layer and the phase characteristic of the Rayleigh mode.

The cut angle of the piezoelectric layer 6 is, for example, equal to or more than about 39° Y and equal to or less than about 48° Y. As shown in FIG. 5, the case where the cut angle of the piezoelectric layer 6 is equal to or more than about 39° Y and equal to or less than about 48° Y is superior in phase characteristics to the case where the cut angle of the piezoelectric layer 6 is less than about 39° Y and the case where the cut angle of the piezoelectric layer 6 is greater than about 48° Y.

Figure 6:
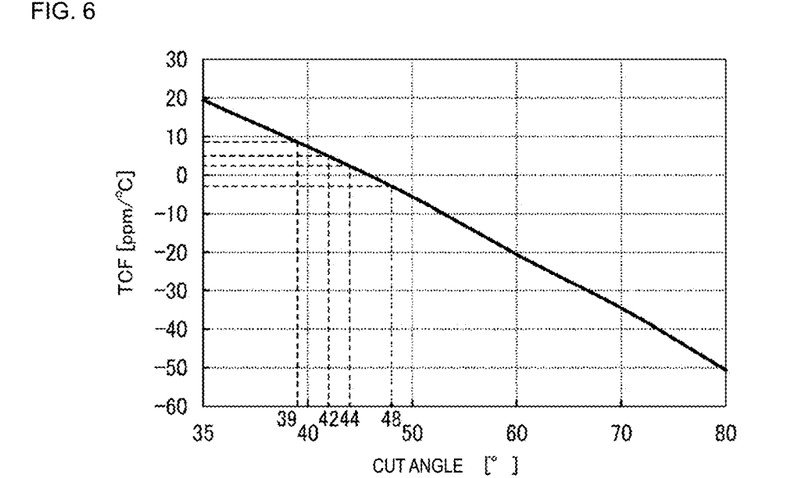
FIG. 6 is a graph showing a relationship between the cut angle of the piezoelectric layer and a TCF.

Preferably, the cut angle of the piezoelectric layer 6 is, for example, equal to or more than about 42° Y. As shown in FIG. 6, the TCF can be reduced. For example, the absolute value of the TCF can be equal to or less than about 5 ppm/° C.

More preferably, the cut angle of the piezoelectric layer 6 is, for example, equal to or more than about 44° Y. This makes it possible to further reduce the TCF. For example, the absolute value of the TCF can be equal to or less than about 2 ppm/° C.

(2.5) Acoustic Velocity of Support Substrate

An acoustic velocity of a slow transversal wave propagating through the support substrate 4 is, for example, equal to or higher than about 3950 m/s. More specifically, the acoustic velocity of the slow transversal wave propagating through the support substrate 4 is, for example, higher than the acoustic velocity about 3800 m/s of resonance and equal to or higher than the acoustic velocity about 3950 m/s of anti-resonance. Thus, good resonance characteristics and anti-resonance characteristics can be obtained.

More preferably, the acoustic velocity of the above-described slow transversal wave propagating through the support substrate 4 is, for example, equal to or higher than about 4100 m/s. More specifically, the acoustic velocity of the above-described slow transversal wave propagating through the support substrate 4 is, for example, equal to or higher than about 4100 m/s, which is the sum of the difference (for example, 150 m/s) between the acoustic velocity of about 3950 m/s of the antiresonance and the acoustic velocity of about 3800 m/s of the resonance and the acoustic velocity of about 3950 m/s of the antiresonance. As such, the characteristics of the ladder filter can be improved.

(2.6) Relationship Between Support Substrate and IDT Electrode

An angle provided by the Z-axis of the support substrate 4 and the X-axis of the LiTaO₃ (the second direction D2) is, for example, equal to or less than about ±20°. In the example of FIG. 3, an angle provided by the Z-axis of the support substrate 4 and the direction (second direction D2) in which the plurality of electrode fingers 72 of the IDT electrode 7 is arranged is, for example, equal to or less than about ±20°. Thus, the acoustic velocity of the slow transversal wave propagating through the support substrate 4 can be set to be, for example, equal to or higher than about 4100 m/s.

More preferably, the angle provided by the Z-axis of the support substrate 4 and the X-axis of the LiTaO₃ (the second direction D2) indicates a parallel or substantially parallel situation. In the example of FIG. 3, the Z-axis of the support substrate 4 is parallel or substantially parallel to the direction in which the plurality of electrode fingers 72 of the IDT electrode is arranged (the second direction D2). As a result, Z propagation can be achieved, and high acoustic velocity in the support substrate 4 can be achieved.

(3) Advantageous Effects

In the acoustic wave device 1 according to the present preferred embodiment, the IDT electrode 7 is provided on the negative surface side of the piezoelectric layer 6, and the cut angle of the piezoelectric layer 6 is, for example, equal to or more than about 39° Y and equal to or less than about 48° Y. As a result, spurious mode can be reduced.

In the acoustic wave device 1 according to the present preferred embodiment, the acoustic velocity of the support substrate 4 is, for example, about 3950 m/s. Thus, good resonance characteristics and antiresonance characteristics can be obtained. As such, the characteristics of the ladder filter can be improved.

In the acoustic wave device 1 according to the present preferred embodiment, the angle provided by the Z-axis of the support substrate 4 and the X-axis of the LiTaO₃ (the second direction D2) is, for example, equal to or less than about ±20°. Thus, the acoustic velocity of the slow transversal wave can be set to be, for example, equal to or higher than about 4100 m/s.

In the acoustic wave device 1 according to the present preferred embodiment, the Z-axis of the support substrate 4 and the X-axis of the LiTaO₃ (the second direction D2) are parallel or substantially parallel to each other. As a result, Z propagation can be achieved, and high acoustic velocity in the support substrate 4 can be achieved.

In the acoustic wave device 1 according to the present preferred embodiment, the cut angle of the piezoelectric layer 6 is, for example, equal to or more than about 42° Y.

Thus, the TCF can be reduced. For example, the absolute value of the TCF can be equal to or less than about 5 ppm/° C.

In the acoustic wave device 1 according to the present preferred embodiment, the cut angle of the piezoelectric layer 6 is, for example, equal to or more than about 44° Y. This makes it possible to further reduce the TCF. For example, the absolute value of the TCF can be equal to or less than about 2 ppm/° C.

In the acoustic wave device 1 according to the present preferred embodiment, the piezoelectric layer 6 is directly laminated on the support substrate 4. As a result, the spurious mode can be further reduced, so that the characteristic deterioration can be reduced or prevented.

In the acoustic wave device 1 according to the present preferred embodiment, the thickness of the piezoelectric layer 6 is, for example, equal to or less than about 3.5λ. Thus, the Q value can be increased.

In the acoustic wave device 1 according to the present preferred embodiment, the thickness of the piezoelectric layer 6 is, for example, equal to or less than about 2.5λ. Thus, the TCF can be improved.

In the acoustic wave device 1 according to the present preferred embodiment, the thickness of the piezoelectric layer 6 is, for example, equal to or less than about 1.5λ. Thus, the electromechanical coupling coefficient can be adjusted in a wide range.

In the acoustic wave device 1 according to the present preferred embodiment, the thickness of the piezoelectric layer 6 is, for example, equal to or more than about 0.05λ and equal to or less than about 0.5λ. Thus, the electromechanical coupling coefficient can be adjusted in a wider range.

(4) Modification

Hereinafter, a modification of a preferred embodiment of the present invention will be described.

Figure 7:
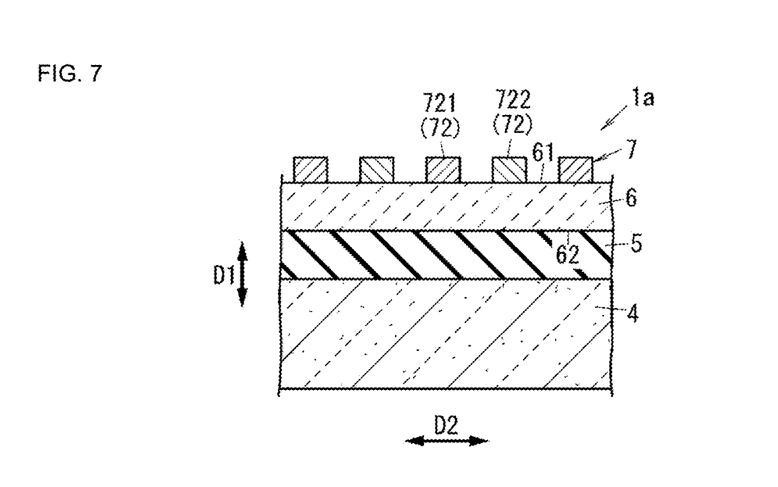
FIG. 7 is a cross-sectional view of an acoustic wave device according to a modification of a preferred embodiment of the present invention.

As a modification of the present preferred embodiment, the piezoelectric layer 6 is not limited to being directly laminated on the support substrate 4, and may be indirectly provided on the support substrate 4. In other words, as illustrated in FIG. 7, another layer may be provided between the piezoelectric layer 6 and the support substrate 4. In the example of FIG. 7, the low acoustic velocity film 5 is provided on the support substrate 4, and the piezoelectric layer 6 may be provided on the low acoustic velocity film 5.

As illustrated in FIG. 7, an acoustic wave device 1a according to the modification includes the support substrate 4, a low acoustic velocity film 5, the piezoelectric layer 6, and the IDT electrode 7.

The low acoustic velocity film 5 is a film in which the acoustic velocity of the bulk wave propagating through the low acoustic velocity film 5 is lower than the acoustic velocity of the bulk wave propagating through the piezoelectric layer 6. The low acoustic velocity film 5 is provided between the support substrate 4 and the piezoelectric layer 6. The low acoustic velocity film 5 is provided between the support substrate 4 and the piezoelectric layer 6, such that the acoustic velocity of the acoustic wave decreases. Acoustic waves inherently concentrate energy in a medium with a low acoustic velocity. Therefore, it is possible to improve the effect of confining the energy of the acoustic wave in the piezoelectric layer 6 and in the IDT electrode 7 in which the acoustic wave is excited. As a result, the loss can be reduced and the Q value can be increased as compared with the case where the low acoustic velocity film 5 is not provided.

A material of the low acoustic velocity film 5 is, for example, silicon oxide. Note that the material of the low acoustic velocity film 5 is not limited to silicon oxide, and may be, for example, glass, silicon oxynitride, tantalum oxide, a compound obtained by adding fluorine, carbon, or boron to silicon oxide, or a material including any of the above materials as a main component.

In a case where the material of the low acoustic velocity film 5 is silicon oxide, the temperature characteristics can be improved. The acoustic constant of LiTaO$_3$ as a material of the piezoelectric layer 6 has a negative temperature characteristic, and the temperature characteristic of silicon oxide has a positive temperature characteristic. Therefore, in the acoustic wave device 1a, the absolute value of the TCF can be reduced. Further, the specific acoustic impedance of silicon oxide is smaller than the specific acoustic impedance of LiTaO$_3$, which is the material of the piezoelectric layer 6. Therefore, it is possible to increase the electromechanical coupling coefficient, that is, expand the fractional band width, and to improve the frequency-temperature characteristics.

A thickness of the low acoustic velocity film 5 is preferably, for example, equal to or less than about 2.0λ. By setting the thickness of the low acoustic velocity film 5 to be equal to or less than about 2.0λ, the film stress can be reduced or prevented, and as a result, the warpage of the wafer can be reduced or prevented, so that a yield rate can be improved and the characteristics can be stabilized. In addition, when the thickness of the low acoustic velocity film 5 is in the range of, for example, equal to or more than about 0.1λ and equal to or less than about 0.5λ, the electromechanical coupling coefficient hardly changes.

Note that as described above, one layer (low acoustic velocity film 5) is provided between the support substrate 4 and the piezoelectric layer 6, but is not limited thereto, and a plurality of layers may be laminated.

Also in the acoustic wave device 1a according to the above-described modification, the same or substantially the same advantageous effects as those of the acoustic wave device 1 according to the above-described preferred embodiment are achieved.

The preferred embodiments and the modifications described above are merely some examples of various preferred embodiments and modifications of the present invention. In addition, the preferred embodiments and the modifications described above can be variously changed according to the design or the like as long as one or more of the advantageous results of preferred embodiments of the present invention and modifications thereof can be achieved.

The following aspects of preferred embodiments of the present invention are disclosed in this specification.

An acoustic wave device (1; 1a) according to a preferred embodiment of the present invention includes a support substrate (4), a piezoelectric layer (6), and an IDT electrode (7). The support substrate (4) is made of quartz. The piezoelectric layer (6) is on the support substrate (4) and is made of LiTaO$_3$. The IDT electrode (7) is on the piezoelectric layer (6) and includes a plurality of electrode fingers (72). The IDT electrode (7) is on a negative surface side of the piezoelectric layer (6). A cut angle of the piezoelectric layer (6) is equal to or more than about 39° Y and equal to or less than about 48° Y. According to the acoustic wave device (1; 1a) of the present preferred embodiment, a spurious mode can be reduced.

In an acoustic wave device (1; 1a) according to a preferred embodiment of the present invention, an acoustic velocity of a slow transversal wave propagating through the support substrate (4) is equal to or more than about 3950 m/s. According to the acoustic wave device (1; 1a) of the above-described preferred embodiment, good resonance characteristics and antiresonance characteristics can be obtained.

In an acoustic wave device (1; 1a) according to a preferred embodiment of the present invention, the acoustic velocity of the slow transversal wave propagating through the support substrate (4) is equal to or higher than about 4100 m/s. According to the acoustic wave device (1; 1a) of the above-described preferred embodiment, the characteristics of the ladder filter can be improved.

In an acoustic wave device (1; 1a) according to a preferred embodiment of the present invention, an angle between a Z-axis of the support substrate (4) and an X-axis of the LiTaO$_3$ (second direction D2) is equal to or less than about ±20°. According to the acoustic wave device (1; 1a) of the above-described preferred embodiment, the acoustic velocity of the slow transversal wave can be equal to or higher than about 4100 m/s.

In an acoustic wave device (1; 1a) according to a preferred embodiment of the present invention, the Z-axis of the support substrate (4) and the X-axis of the LiTaO$_3$ (the second direction D2) are parallel or substantially parallel to each other. According to the acoustic wave device (1; 1a) of the above-described preferred embodiment, Z propagation can be achieved, so that high acoustic velocity can be achieved in the support substrate (4).

In an acoustic wave device (1; 1a) according to a preferred embodiment of the present invention, the cut angle of the piezoelectric layer (6) is equal to or more than about 42° Y. According to the acoustic wave device (1; 1a) of the above-described preferred embodiment, a TCF can be reduced. For example, the absolute value of the TCF can be equal to or less than about 5 ppm/° C.

In an acoustic wave device (1; 1a) according to a preferred embodiment of the present invention, the cut angle of the piezoelectric layer (6) is equal to or more than about 44° Y. According to the acoustic wave device (1; 1a) of the above-described preferred embodiment, the TCF can be further reduced. For example, the absolute value of TCF can be equal to or less than about 2 ppm/° C.

In an acoustic wave device (1) according to a preferred embodiment of the present invention, the piezoelectric layer (6) is directly laminated on the support substrate (4). According to the acoustic wave device (1) of the above-described preferred embodiment, the spurious mode can be further reduced, and thus the characteristic degradation can be suppressed.

A high-frequency front-end circuit (300) according to a preferred embodiment of the present invention includes a filter (first filter 21; second filter 22; third filter 23; fourth filter 24) and an amplifier circuit (first amplifier circuit 303; second amplifier circuit 304). The filter includes an acoustic wave device (1; 1a) according to a preferred embodiment of the present invention, and allows a high-frequency signal in a predetermined frequency band to pass therethrough. The amplifier circuit is connected to the filter and amplifies the amplitude of the high-frequency signal. According to the high-frequency front-end circuit (300) of the above-described preferred embodiment, the spurious mode can be reduced in the acoustic wave device (1; 1a).

A communication device (400) according to a preferred embodiment of the present invention includes a high-frequency front-end circuit (300) according to a preferred embodiment of the present invention and a signal processing circuit (401). The signal processing circuit (401) processes a high-frequency signal. According to the communication device (400) of the above-described preferred embodiment, the spurious mode can be reduced in the acoustic wave device (1; 1a).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support substrate made of quartz;
a piezoelectric layer on the support substrate and made of LiTaO$_3$; and
an IDT electrode on the piezoelectric layer and including a plurality of electrode fingers; wherein
the IDT electrode is on a negative surface side of the piezoelectric layer;
a cut angle of the piezoelectric layer is equal to or more than about 39°Y and equal to or less than about 48°Y; and
an angle defined by a Z-axis of the support substrate and an X-axis of the LiTaO$_3$ is equal to or less than about +20°.

2. The acoustic wave device according to claim 1, wherein an acoustic velocity of a slow transversal wave propagating through the support substrate is equal to or higher than about 3950 m/s.

3. The acoustic wave device according to claim 2, wherein the acoustic velocity of the slow transversal wave propagating through the support substrate is equal to or higher than about 4100 m/s.

4. The acoustic wave device according to claim 3, wherein the cut angle of the piezoelectric layer is equal to or more than about 42°Y.

5. The acoustic wave device according to claim 2, wherein the cut angle of the piezoelectric layer is equal to or more than about 42°Y.

6. The acoustic wave device according to claim 1, wherein the cut angle of the piezoelectric layer is equal to or more than about 42°Y.

7. The acoustic wave device according to claim 6, wherein the cut angle of the piezoelectric layer is equal to or more than about 44°Y.

8. The acoustic wave device according to claim 1, wherein the piezoelectric layer is directly laminated on the support substrate.

9. A high-frequency front-end circuit comprising:
a filter that includes the acoustic wave device according to claim 1 and allows a high-frequency signal in a predetermined frequency band to pass through the filter; and
an amplifier circuit connected to the filter and configured to amplify an amplitude of the high-frequency signal.

10. A communication device comprising:
the high-frequency front-end circuit according to claim 9; and
a signal processing circuit to process the high-frequency signal.

11. The acoustic wave device according to claim 1, wherein the Z-axis of the support substrate and the X-axis of the LiTaO$_3$ are parallel or substantially parallel to each other.

12. The acoustic wave device according to claim 11, wherein the cut angle of the piezoelectric layer is equal to or more than about 42°Y.

13. An acoustic wave device comprising:
a support substrate made of quartz;
a piezoelectric layer on the support substrate and made of LiTaO$_3$; and
an IDT electrode on the piezoelectric layer and including a plurality of electrode fingers; wherein
the IDT electrode is on a negative surface side of the piezoelectric layer;
a cut angle of the piezoelectric layer is equal to or more than about 39°Y and equal to or less than about 48°Y;
an acoustic velocity of a slow transversal wave propagating through the support substrate is equal to or higher than about 3950 m/s; and
an angle defined by a Z-axis of the support substrate and an X-axis of the LiTaO$_3$ is equal to or less than about ±20°.

14. An acoustic wave device comprising:
a support substrate made of quartz;
a piezoelectric layer on the support substrate and made of LiTaO$_3$; and
an IDT electrode on the piezoelectric layer and including a plurality of electrode fingers; wherein
the IDT electrode is on a negative surface side of the piezoelectric layer;
a cut angle of the piezoelectric layer is equal to or more than about 42°Y and equal to or less than about 48°Y; and
an angle defined by a Z-axis of the support substrate and an X-axis of the LiTaO$_3$ is equal to or less than about +20°.

* * * * *